United States Patent [19]

Byrum, Jr. et al.

[11] 3,942,161

[45] Mar. 2, 1976

[54] SELECTIVE CONTROL OF DISCHARGE POSITION IN GAS DISCHARGE DISPLAY/MEMORY DEVICE

[75] Inventors: Bernard W. Byrum, Jr., Toledo; Roger E. Ernsthausen, Luckey, both of Ohio

[73] Assignee: Owens-Illinois, Inc., Toledo, Ohio

[22] Filed: June 25, 1974

[21] Appl. No.: 482,875

Related U.S. Application Data

[63] Continuation-in-part of Ser. No. 267,102, June 28, 1972, Pat. No. 3,823,394.

[52] U.S. Cl.. 340/173 PL; 315/169 TV; 340/324 M

[51] Int. Cl. ........................ H03b 37/00; H01j 17/04

[58] Field of Search ....................... 340/173 PL, 324; 315/169 TV

[56] References Cited

UNITED STATES PATENTS

| | | | |
|---|---|---|---|
| 3,499,167 | 3/1970 | Baker | 340/173 PC |
| 3,551,721 | 12/1970 | Holz | 340/173 PC |
| 3,559,190 | 1/1971 | Bitzer | 340/173 PC |
| 3,573,542 | 4/1971 | Mayer | 340/173 PC |
| 3,689,912 | 9/1972 | Dick | 340/173 PC |

*Primary Examiner*—Terrell W. Fears
*Attorney, Agent, or Firm*—Donald Keith Wedding

[57] ABSTRACT

There is disclosed a gas discharge display/memory device wherein the discharge is selectively controlled for various advantages, particularly increased light output and panel brightness. The device is characterized by an ionizable gaseous medium in a thin gas chamber between a pair of opposed dielectric charge storage members, each dielectric member being backed by an array of electrodes with each array being appropriately oriented relative to the other array so as to form a multiplicity of gas discharge cells. Both opposing dielectric charge storage surfaces of each cell are coated with a first layer of low electron yield material and a second layer of high electron yield material—in the geometric form of dots, lines, etc.—the second layer being appropriately positioned such that it is surrounded by the first layer of low electron yield material and such that two opposing surfaces of high electron yield material at or near a discharge cell site cause the cell discharge to occur at the pair of opposing surfaces of high electron yield material. The relative position of the high electron yield material surfaces can be utilized to maximize the visible light output from the panel. The Townsend's (gamma) second coefficient of the high electron yield material is at least 1.5 times the Townsend's second coefficient of the low electron yield material.

1 Claim, 9 Drawing Figures

SELECTIVE CONTROL OF DISCHARGE POSITION IN GAS DISCHARGE DISPLAY/MEMORY DEVICE

RELATED APPLICATION

This is a continuation-in-part of copending U.S. patent application Ser. No. 267,102, now Pat. No. 3,823,394 filed June 28, 1972.

BACKGROUND OF THE INVENTION

This invention relates to gas discharge devices, especially multiple gas discharge display/memory devices which have an electrical memory and which are capable of producing a visual display or representation of data such as numerals, letters, radar displays, aircraft displays, binary works, educational displays, etc.

Multiple gas discharge display and/or memory panels of one particular type with which the present invention is concerned are characterized by an ionizable gaseous medium, usually a mixture of at least two gases at an appropriate gas pressure, in a thin gas chamber or space between a pair of opposed dielectric charge storage members which are backed by conductor (electrode) members, the conductor members backing each dielectric member typically being appropriately oriented so as to define a plurality of discrete gas discharge units or cells.

In some prior art panels the discharge cells are additionally defined by surrounding or confining physical structure such as apertures in perforated glass plates and the like so as to by physically isolated relative to other cells. In either case, with or without the confining physical structure, charges (electrons, ions) produced upon ionization of the elemental gas volume of a selected discharge cell, when proper alternating operating potentials are applied to selected conductors thereof, are collected upon the surfaces of the dielectric at specifically defined locations and constitute an electrical field opposing the electrical field which created them so as to terminate the discharge for the remainder of the half cycle and aid in the initiation of a discharge on a succeeding opposite half cycle of applied voltage, such charges as are stored constituting an electrical memory.

Thus, the dielectric layers prevent the passage of substantial conductive current from the conductor members to the gaseous medium and also serve as collecting surfaces for ionized gaseous medium charges (electrons, ions) during the alternate half cycles of the A.C. operating potentials, such charges collecting first on one elemental or discrete dielectric surface area on alternate half cycles to constitute an electrical memory.

An example of a panel structure containing non-physically-isolated or open discharge cells is disclosed in U.S. Pat. No. 3,499,167 issued to Theodore C. Baker, et al.

An example of a panel containing physically isolated cells is disclosed in the article by D. L. Bitzer and H. G. Slottow entitled "The Plasma Display Panel — A Digitally Addressable Display With Inherent Memory", Proceeding of the Fall Joint Computer Conference, IEEE, San Francisco, California, Nov. 1966, pp. 541–547. Also reference is made to U.S. Pat. No. 3,559,190.

In the construction of the panel, a continuous volume of ionizable gas is confined between a pair of dielectric surfaces backed by conductor arrays typically forming matrix elements. The cross conductor arrays may be orthogonally related (but any other configuration of conductor arrays may be used) to define a plurality of opposed pairs of charge storage areas on the surfaces of the dielectric bounding or confining the gas. Thus, for a conductor matrix having H rows and C columns the number of elemental or discrete areas will be twice the number of such elemental discharge cells.

In addition, the panel may comprise a so-called monolithic structure in which the conductor arrays are created on a single substrate and wherein two or more arrays are separated from each other and from the gaseous medium by at least one insulating member. In such a device the gas discharge takes place not between two opposing electrodes, but between two contiguous or adjacent electrodes on the same substrate; the gas being confined between the substrate and an outer retaining wall.

It is also feasible to have a gas discharge device wherein some of the conductive or electrode members are in direct contact with the gaseous medium and the remaining electrode members are appropriately insulated form such gas, i.e., at least one insulated electrode.

In addition to the matrix configuration, the conductor arrays may be shaped otherwise. Accordingly, while the preferred conductor arrangement is of the crossed grid type as discussed herein, it is likewise apparent that where a maximal variety of two dimensional display patterns is not necessary, as where specific standardized visual shapes (e.g., numerals, letters, words, etc.) are to be formed and image resolution is not critical, the conductors may be shaped accordingly, i.e., a segmented display.

The gas is one which produces visible light or invisible radiation which stimulates a phosphor (if visual display is an objective) and a copious supply of charges (ions and electrons) during discharge.

In prior art, a wide variety of gases and gas mixtures have been utilized as the gaseous medium in a gas discharge device. Typical of such gases include CO; $CO_2$; halogens; nitrogen; $NH_3$; oxygen; water vapor; hydrogen; hydrocarbons; $P_2O_5$; boron fluoride, acid fumes; $TiCl_4$; Group VIII gases; air; $H_2O_2$; vapors of sodium, mercury, thallium, cadmium, rubidium, and cesium; carbon disulfide, laughing gas; $H_2S$; deoxygenated air; phosphorus vapors; $C_2H_2$; $CH_4$; naphthalene vapor; anthracene; freon; ethyl alcohol; methylene bromide; heavy hydrogen; electron attaching gases; sulfur hexafluoride, tritium; radioactive gases; and the rare or inert gases.

In one preferred embodiment hereof the medium comprises at least one rare gas, more preferably at least two, selected from helium, neon, argon, krypton, or xenon.

In an open cell Baker, et al. type panel, the gas pressure and the electric field are sufficient to laterally confine charges generated on discharge within elemental or discrete dielectric areas within the perimeter of such areas, especially in a panel containing non-isolated discharge cells. As described in the Baker, et al. patent, the space between the dielectric surfaces occupied by the gas is such as to permit photons generated on discharge in a selected discrete or elemental volume of gas to pass freely through the gas space and strike surface areas of dielectric remote from the selected discrete volumes, such remote, photon struck dielectric surface areas thereby emitting electrons so as to condition at least one elemental volume other than the elemental volume in which the photons originated.

With respect to the memory function of a given discharge panel, the allowable distance or spacing between the dielectric surfaces depends, inter alia, on the frequency of the alternating current supply, the distance typically being greater for lower frequencies.

While the prior art does disclose gaseous discharge devices having externally positioned electrodes for initiating a gaseous discharge, sometimes called "electrodeless discharge", such prior art devices utilized frequencies and spacing or discharge volumes and operating pressures such that although discharges are initiated in the gaseous medium, such discharges are ineffective or not utilized for charge generation and storage at higher frequencies; although charge storage may be realized at lower frequencies, such charge storage has not been utilized in a display/memory device in the manner of the Bitzer-Slottow or Baker, et al. invention.

The term "memory margin" is defined herein as $$M.\ M. = \frac{V_f - V_E}{V_f/2}$$

where $V_f$ is the half amplitude of the smallest sustaining voltage signal which results in a discharge every half cycle, but at which the cell is not bi-stable and $V_E$ is the half amplitude of the minimum applied voltage sufficient to sustain discharges once initiated.

It will be understood that the basic electrical phenomenon utilized in this invention is the generation of charges (ions and electrons) alternately storable at pairs of opposed or facing discrete points or areas on a pair of dielectric surfaces backed by conductors connected to a source of operating potential. Such stored charges result in an electrical field opposing the field produced by the applied potential that created them and hence operate to terminate ionization in the elemental gas volume between opposed or facing discrete points or areas of dielectric surface. The term "sustain a discharge" means producing a sequence of momentary discharges, at least one discharge for each half cycle of applied alternating sustaining voltage, once the elemental gas volume has been fired, to maintain alternate storing of charges at pairs of opposed discrete areas on the dielectric surfaces.

As used herein, a cell is in the "on state" when a quantity of charge is stored in the cell such that on each half cycle of the sustaining voltage, a gaseous discharge is produced.

In addition to the sustaining voltage, other voltages may be utilized to operate the panel, such as firing, addressing, and writing voltages.

A "firing voltage" is any voltage, regardless of source, required to discharge a cell. Such voltage may be completely external in origin or may be comprised of internal cell wall voltage in combination with externally originated voltages.

An "addressing voltage" is a voltage produced on the panel X — Y electrode coordinates such that at the selected cell or cells, the total voltage applied across the cell is equal to or greater than the firing voltage whereby the cell is discharged.

A "writing voltage" is an addressing voltage of sufficient magnitude to make it probable that on subsequent sustaining voltage half cycles, the cell will be in the on state.

In the operation of a multiple gaseous discharge device, of the type described hereinbefore, it is necessary to condition the discrete elemental gas volume of each discharge cell by supplying at least one free electron thereto such that a gaseous discharge can be initiated when the cell is addressed with an appropriate voltage signal.

The prior art has disclosed and practiced various means for conditioning gaseous discharge cells.

One such means of panel conditioning comprises a so-called electronic process whereby an electronic conditioning signal or pulse is periodically applied to all of the panel discharge cells, as disclosed for example in British patent specification No. 1,161,832, page 8, lines 56 to 76. Reference is also made to U.S. Pat. No. 3,559,190 and "The Device Characteristics of the Plasma Display Element" by Johnson, et al., IEEE Transactions On Electron Devices, Sept. 1971. However, electronic conditioning is self-conditioning and is only effective after a discharge cell has been previously conditioned; that is, electronic conditioning involves periodically discharging a cell and is therefore a way of maintaining the presence of free electrons. Accordingly, one cannot wait too long between the periodically applied conditioning pulses since there must be at least one free electron present in order to discharge and condition a cell.

Another conditioning method comprises the use of external radiation, such as flooding part or all of the gaseous medium of the panel with ultraviolet radiation. This external conditioning method has the obvious disadvantage that it is not always convenient or possible to provide external radiation to a panel, especially if the panel is in a remote position. Likewise, an external UV source requires auxiliary equipment. Accordingly, the use of internal conditioning is generally preferred.

One internal conditioning means comprises using internal radiation, such as by the inclusion of a radioactive material.

Another means of internal conditioning, which we call photon conditioning, comprises using one or more so-called pilot discharge cells in the on-state for the generation of photons. This is particularly effective in a so-called open cell construction (as described in the Baker, et al. patent) wherein the space betweeen the dielectric surfaces occupied by the gas is such as to permit photons generated on discharge in a selected discrete or elemental volume of gas (discharge cell) to pass freely through the panel gas space so as to condition other and more remote elemental volumes of other discharge units. In addition to or in lieu of the pilot cells, one may use other sources of photons internal to the panel.

Internal photon conditioning may be unreliable when a given discharge unit to be addressed is remote in distance relative to the conditioning source, e.g., the pilot cell. Accordingly, a multiplicity of pilot cells may be required for the conditioning of a panel having a large geometric area. In one highly convenient arrangement, the panel matrix border (perimeter) is comprised of a plurality of such pilot cells.

In a multiple gas discharge display/memory device utilized for visual display, visible light is emitted from the area of each discharge cell in the on state. However, a portion of this light is typically blocked from view by the width of the conductor electrode. Although one or both electrodes can be constructed out of transparent materials, such materials are usually low in electroconductivity.

The practice of this invention allowed the relative position of a gas discharge to be controlled so as to increase the visibility of light emitted therefrom.

In accordance with the practice of this invention, the gas discharge of a selected gas discharge cell is controllably positioned by providing opposing areas of high electron yield material on each opposing dielectric charge storage surface, each area being located at or near a cell site and surrounded by a low electron yield material.

More particularly, isolated, island-like areas of high electron yield material are applied as opposite area pairs to each opposing dielectric charge storage surface, each area being surrounded by a low electron yield material and each pair being positioned at or near the site of a gas discharge cell such that the discharge can be selectively controlled.

The low electron yield material and the high electron yield material may be applied to each dielectric surface by any convenient process. Typical processes of application include photolithography, chemical deposition, electron beam evaporation, sputtering, deposition through a mastic such as silk screening and so forth.

In one specific embodiment, a continuous or discontinuous layer of low electron yield material is first applied to each opposing charge storage surface with islands of high electron yield material then being selectively applied over the layer of low electron yield material.

In another embodiment, the islands are first applied and the low electron yield material is then applied so as to surround, without covering, the islands.

The islands (or spots) of high electron yield material may be of any suitable geometric shape such as circular, triangular, rectangular, square, etc. Also the geometry may include insulated lines, dots, and so forth.

The layer thickness of each material—low or high electron yielding—must be at least 100 angstrom units with a range of about 100 to about 50,000 angstrom units.

As used herein, the term "electron yield" refers to the material's secondary electron emission produced by heavy particle impact and/or photons as determined by Townsend's second ionization (gamma) coefficient. Reference is made to Introduction to Electrical Discharge in Gases by Sanborn C. Brown, published by John Wiley and Sons, Inc., New York, 1966, especially pages 119 to 123.

A high electron yield material is one having a high Townsend second coefficient. A low electron yield material is one having a low Townsend second coefficient.

In the practice of this invention, the ratio of the high Townsend coefficient material to the low Townsend coefficient material is typically at least 1:5. The higher the ratio, the more the discharges will tend to be focused at the islands of high electron yield material.

Examples of high electron yield materials include lead oxide, bismuth oxide, and rare earth sesquioxides, especially ytterbium oxide, lanthanum oxide, erbium oxide, and samarium oxide. Some particularly preferred high electron yield materials include magnesium oxide, and various cesium compounds such as, cesium oxide and the cesium halides, such as cesium fluoride and cesium iodide.

Examples of low electron yield materials include aluminum oxide, silicon oxide, zirconium oxide, titanium oxide, and hafnium oxide. Some particularly preferred low electron yield materials include elemental carbon and silicon.

In one embodiment hereof, it is contemplated treating a high electron yield material so as to convert it into a low electron yield material. This may be accomplished by means of ion implantation, sputtering techniques, and so forth.

Reference is made to the accompanying drawings and the hereinafter discussed figures shown thereon.

FIG. 1 is a plan view of a dielectric body comprising a circular spot 1 of a high electron yield material surrounded by a continuous body 2 of low electron yield material.

FIG. 2*a* is a cross-sectional view of FIG. 1 showing body 2 as a sub-layer to the spot 1.

FIG. 2*b* is a cross-sectional view of FIG. 1 showing spot 1 as being within the same layer of body 2.

Figure 1:
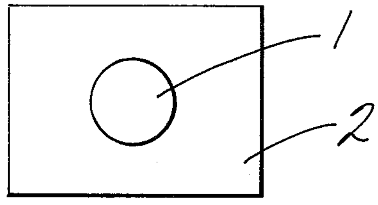
Figure 2A:
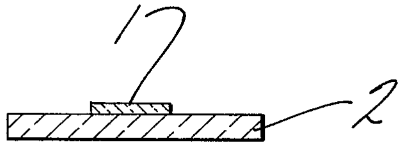
Figure 2B:
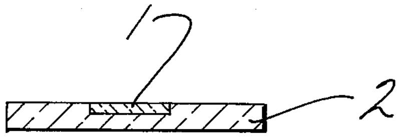

The invention utilizes a pair of dielectric films 10 and 11 separated by a thin layer or volume of a gaseous discharge medium 12, the medium 12 producing a copious supply of charges (ions and electrons) which are alternately collectable on the surfaces of the dielectric members at opposed or facing elemental or discrete areas X and Y defined by the conductor matrix on non-gas-contacting sides of the dielectric members, each dielectric member presenting large open surface areas and a plurality of pairs of elemental X and Y areas. While the electrically operative structural members such as the dielectric members 10 and 11 and conductor matrixes 13 and 14 are all relatively thin (being exaggerated in thickness in the drawings) they are formed on and supported by rigid nonconductive support members 16 and 17 respectively.

Preferably, one or both of nonconductive support members 16 and 17 pass light produced by discharge in the elemental gas volumes. Preferably, they are transparent glass members and these members essentially define the overall thickness and strength of the panel. For example, the thickness of gas layer 12 as determined by spacer 15 is usually under 10 mils and preferably about 4 to 6 mils, dielectric layers 10 and 11 (over the conductors at the elemental or discrete X and Y areas) are usually between 1 and 2 mils thick, and conductors 13 and 14 about 8,000 angstroms thick. However, support members 16 and 17 are much thicker (particularly in larger panels) so as to provide as much ruggedness as may be desired to compensate for stresses in the panel. Support members 16 and 17 also serve as heat sinks for heat generated by discharges and thus minimize the effect of temperature on operation of the device. If it is desired that only the memory function be utilied, then none of the members need be transparent to light.

Except for being nonconductive or good insulators the electrical properties of support members 16 and 17 are not critical. The main function of support members 16 and 17 is to provide mechanical support and strength for the entire panel, particularly with respect to pressure differential acting on the panel and thermal shock. As noted earlier, they should have thermal expansion characteristics substantially matching the thermal expansion characteristics of dielectric layers 10 and 11. Ordinary ¼ in. commercial grade soda lime plate glasses have been used for this purpose. Other glasses such as low expansion glasses or transparent devitrified glasses can be used provided they can withstand processing and have expansion characteristics substantially matching expansion characteristics of the dielectric coatings 10 and 11. For given pressure differentials and thickness of plates, the stress and deflection of plates may be determined by following standard stress and strain formulas (see R. J. Roark, *Formulas for Stress and Strain*, McGraw-Hill, 1954).

Spacer 15 may be made of the same glass material as dielectric films 10 and 11 and may be an integral rib formed on one of the dielectric members and fused to the other members to form a bakeable hermetic seal enclosing and confining the ionizable gas volume 12. However, a separate final hermetic seal may be effected by a high strength devitrified glass sealant 15S. Tubulation 18 is provided for exhausting the space between dielectric members 10 and 11 and filling that space with the volume of ionizable gas. For large panels small beadlike solder glass spacers such as shown at 15B may be located between conductor intersections and fused to dielectric member 10 and 11 to aid in withstanding stress on the panel and maintain uniformity of thickness of gas volume 12.

Figure 4:
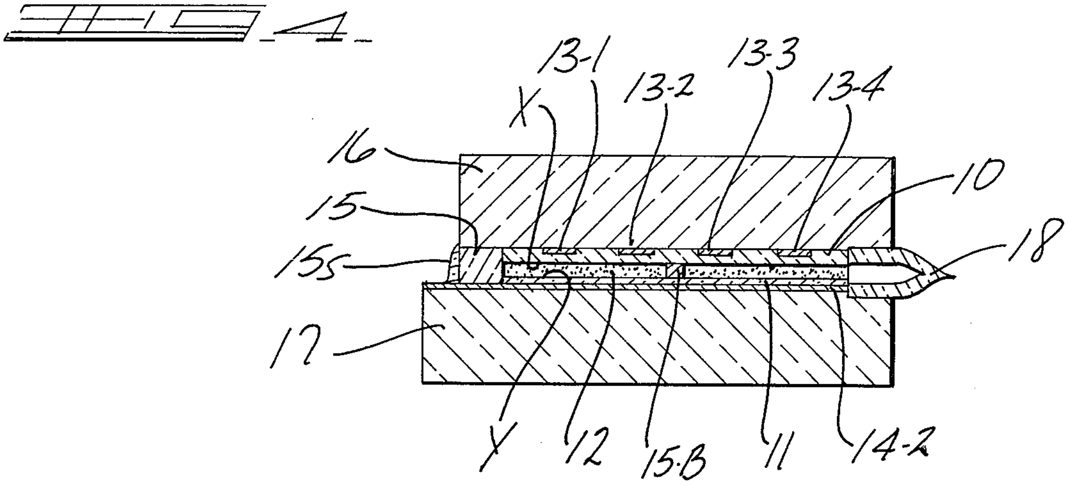
FIG. 4 is a cross-sectional view (enlarged, but not to proportional scale since the thickness of the gas volume, dielectric members and conductor arrays have been enlarged for purposes of illustration) taken on lines 2 — 2 of FIG. 1.
Figure 3:
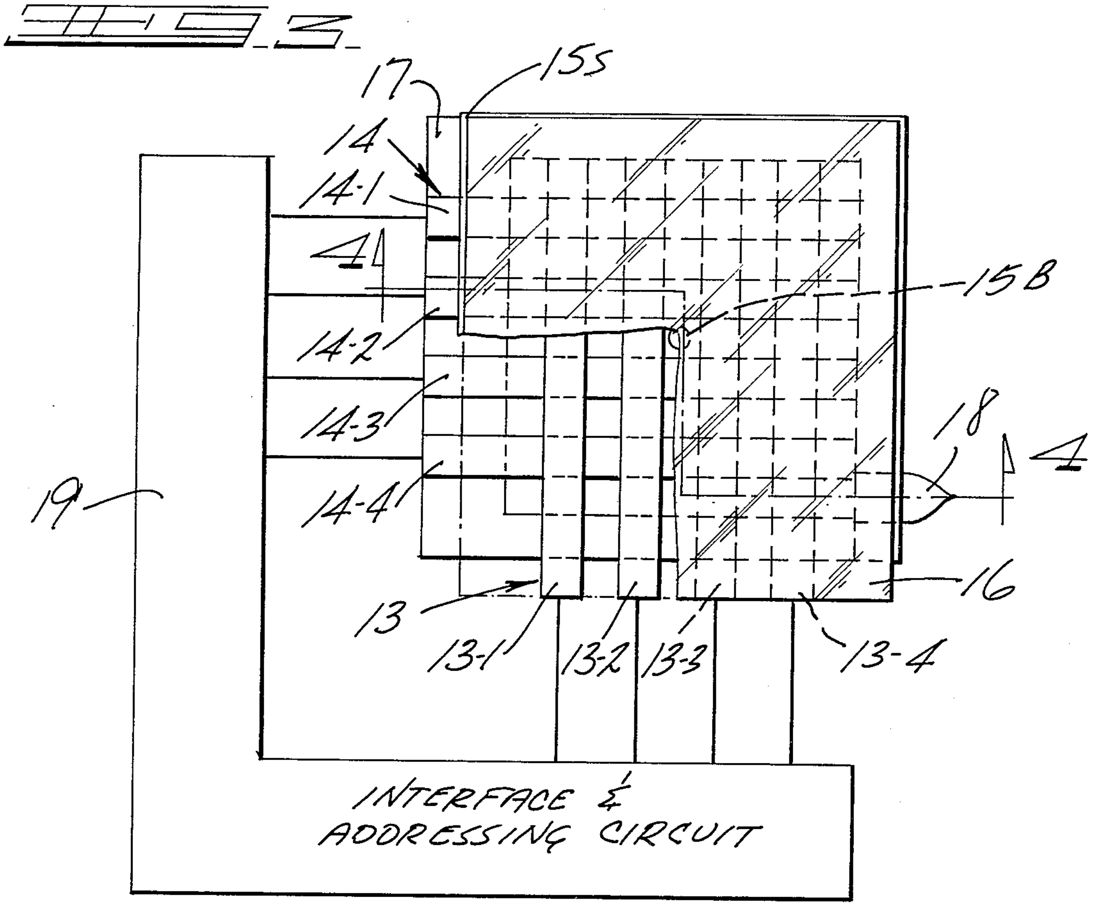
FIG. 3 is a partially cut-away plan view of a gaseous discharge display/memory panel as connected to a diagrammatically illustrated source of operating potentials.
Figure 5:
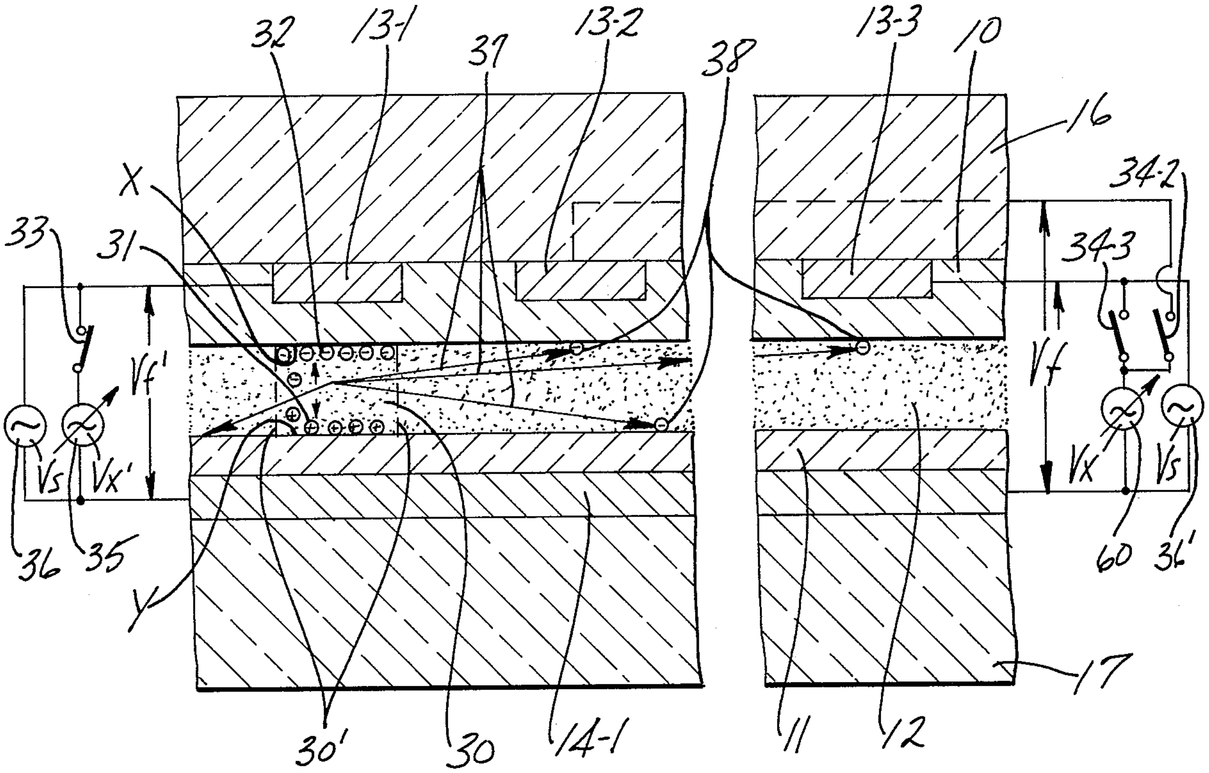
FIG. 5 is an explanatory partial cross-sectional view similar to FIG. 2 (enlarged, but not to proportional scale).
Figure 6:
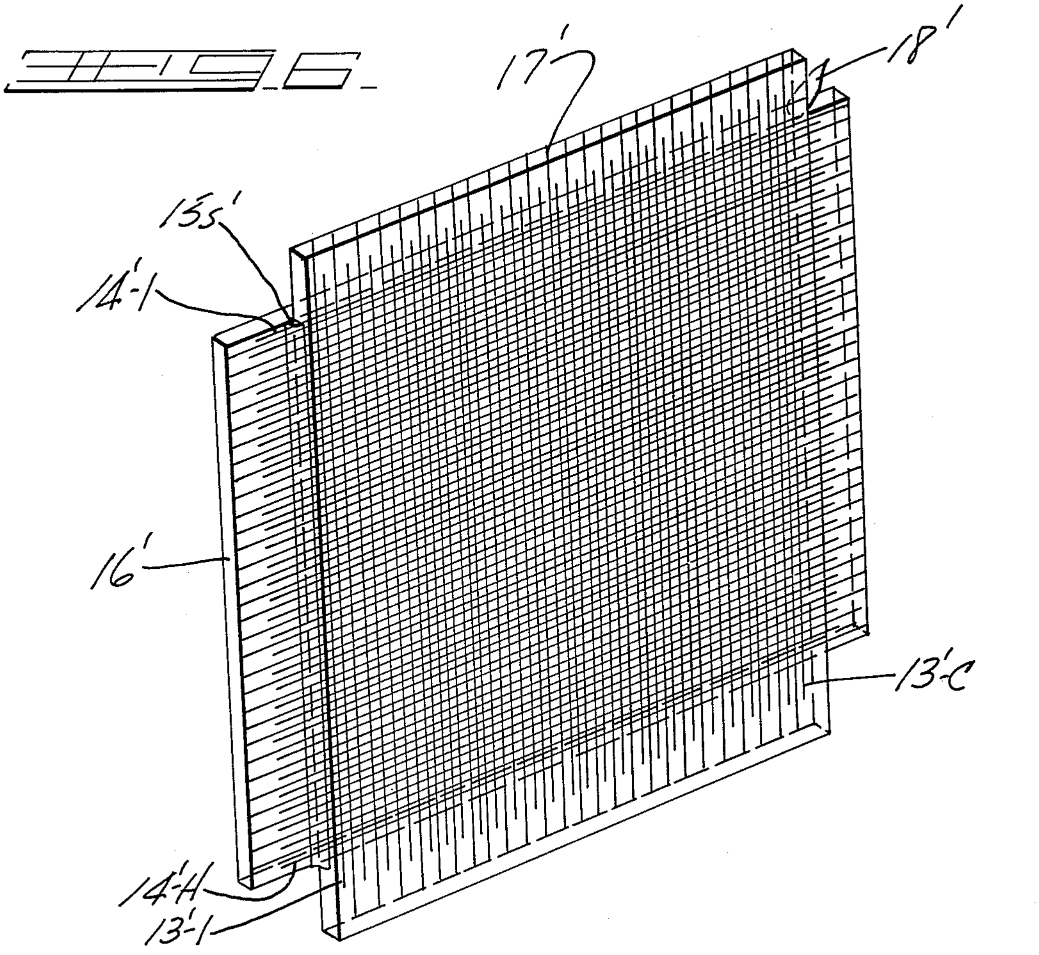
FIG. 6 is an isometric view of a gaseous discharge display/memory panel.

Conductor arrays 13 and 14 may be formed on support members 16 and 17 by a number of well-known processes, such as photoetching, vacuum deposition, stencil screening, etc. In the panel shown in FIG. 4, the center-to-center spacing of conductors in the respective arrays is about 17 mils. Transparent or semi-transparent conductive material such as tin oxide, gold or aluminum can be used to form the conductor arrays and should have a resistance less than 3000 ohms per line. Narrow opaque electrodes may alternately be used so that discharge light passes around the edges of the electrodes to the viewer. It is important to select a conductor material that is not attacked during processing by the dielectric material.

It will be appreciated that conductor arrays 13 and 14 may be wires or filaments of copper, gold, silver or aluminum or any other conductive metal or material. For example 1 mil wire filaments are commercially available and may be used in the invention. However, formed in situ conductor arrays are preferred since they may be more easily and uniformly placed on and adhered to the support plates 16 and 17.

Dielectric layer members 10 and 11 are formed of an inorganic material and are preferably formed in situ as an adherent film or coating which is not chemically or physically effected during bake-out of the panel. One such material is a solder glass such as Kimble SG-68 manufactured by and commercially available from the assignee of the present invention.

This glass has thermal expansion characteristics substantially matching the thermal expansion characteristics of certain soda-lime glasses, and can be used as the dielectric layer when the support members 16 and 17 are soda-lime glass plates. Dielectric layers 10 and 11 must be smooth and have a dielectric strength of about 1000 v. and be electrically homogeneous on a microscopic scale (e.g., no cracks, bubbles, crystals, dirt, surface films, etc.). In addition, the surfaces of dielectric layers 10 and 11 should be good photoemitters of electrons in a baked out condition. Alternatively, dielectric layers 10 and 11 may be overcoated with materials designed to produce good electron emission, as in U.S. Pat. No. 3,634,719, issued to Roger E. Ernsthausen. Of course, for an optical display at least one of dielectric layers 10 and 11 should pass light generated on discharge and be transparent or translucent and, preferably, both layers are optically transparent.

The preferred spacing between surfaces of the dielectric films is about 4 to 6 mils with conductor arrays 13 and 14 having center-to-center spacing of about 17 mils.

The ends of conductors 14—1 . . . 14—4 and support member 17 extend beyond the enclosed gas volume 12 and are exposed for the purpose of making electrical connection to interface and addressing circuitry 19. Likewise, the ends of conductors 13—1 . . . 13—4 on support member 16 extend beyond the enclosed gas volume 12 and are exposed for the purpose of making electrical connection to interface and addressing circuitry 19.

As in known display systems, the interface and addressing circuitry or system 19 may be relatively inexpensive line scan systems or the somewhat more expensive high speed random access systems. In either case, it is to be noted that a lower amplitude of operating potentials helps to reduce problems associated with the interface circuitry between the addressing system and the display/memory panel, per se. Thus, by providing a panel having greater uniformity in the discharge characteristics throughout the panel, tolerances and operating characteristics of the panel with which the interfacing circuitry cooperate, are made less rigid.

Figure 7:
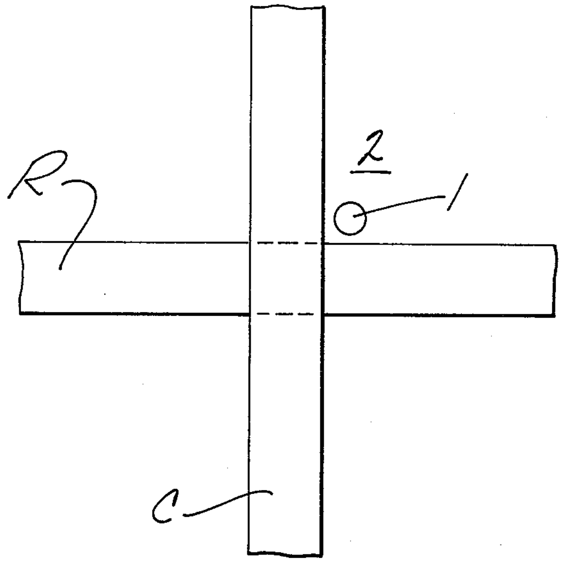
FIG. 7 is an embodiment of the invention having two opposing high electron yield supports surrounded by low electron yield material.

In FIG. 7 there is shown a plan view of one embodiment of this invention wherein two opposing high electron yield material spots 1 surrounded by low electron yield material 2 are positioned close to the discharge cell formed by the intersection of electrodes R and C.

Figure 8:
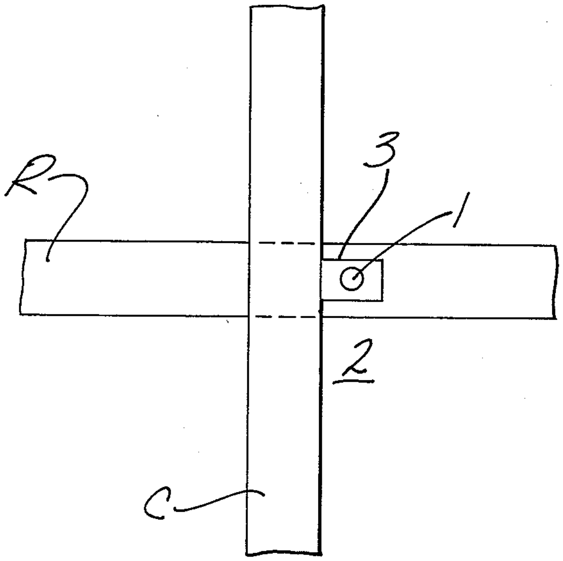
FIG. 8 is an embodiment using a spur or cantilever electrode position.

In FIG. 8 a transparent spur or cantilever electrode portion 3 is extended from the side of electrode C over electrode R. The spots 1 are positioned between the spur 3 and electrode R.

The spots 1 may be positioned at any suitable location so as to controllably draw the discharge to a desired location.

The spots may also be positioned directly at each discharge cell site so as to better define the discharge at each site. In such an embodiment, part of one or both electrodes at each cell site may be open or split such as in a ladder or window arrangement. Likewise, a portion of the electrodes at the cell site may be transparent. However, it is not feasible to construct all of the electrodes out of transparent material since such materials tend to have low electron conductivity which thereby increases the overall power requirements of the system.

It will be obvious to those skilled in the art that many other geometric arrangements are feasible.

We claim:

1. In a multiple gaseous discharge display/memory panel characterized by two opposing dielectric charge storage surfaces backed by electrode arrays defining gas discharge cell sites, the improvement wherein the gas discharge of a selected gas discharge cell is controllably positioned by providing opposing areas of high electron yield material selected from magnesium oxide, cesium oxide and cesium halides on each opposing dielectric charge storage surface, each area being located at or near a cell site and surrounded by a low electron yield material selected from carbon and silicon.

* * * * *